United States Patent [19]
Lebby et al.

[11] Patent Number: 5,482,658
[45] Date of Patent: Jan. 9, 1996

[54] METHOD OF MAKING AN OPTOELECTRONIC INTERFACE MODULE

[75] Inventors: Michael S. Lebby, Apache Junction; Christopher K. Y. Chun, Mesa; Shun-Meen Kuo, Chandler; Kent W. Hansen, Scottsdale, all of Ariz.

[73] Assignee: Motorola, Schaumburg, Ill.

[21] Appl. No.: 106,472

[22] Filed: Aug. 13, 1993

[51] Int. Cl.⁶ .................................................. B29D 11/00
[52] U.S. Cl. .................... 264/1.24; 264/1.7; 264/272.15; 264/279; 264/279.1; 264/328.1; 156/60; 385/14
[58] Field of Search ..................... 264/1.5, 1.7, 272.15, 264/1.24, 1.25, 272.14, 272.17, 279, 279.1, 328.1; 385/14, 88, 92; 156/244.12, 60

[56] References Cited

U.S. PATENT DOCUMENTS

| | | | |
|---|---|---|---|
| 4,410,469 | 10/1983 | Katagiri et al. | 264/1.5 |
| 4,822,536 | 4/1989 | Volnis et al. | 264/272.17 |
| 5,044,720 | 9/1991 | Haley et al. | 264/1.5 |
| 5,071,223 | 12/1991 | Gotoh et al. | 385/14 |
| 5,103,494 | 4/1992 | Mozer | 385/14 |
| 5,123,066 | 6/1992 | Acarlar | 385/14 |
| 5,249,245 | 9/1993 | Lebby et al. | 264/1.5 |
| 5,271,083 | 12/1993 | Lebby et al. | 264/1.7 |

FOREIGN PATENT DOCUMENTS

| | | | |
|---|---|---|---|
| 4207207 | 9/1993 | Germany | 385/14 |
| 4208278 | 9/1993 | Germany | 385/14 |
| 63-292690 | 11/1988 | Japan | 264/272.14 |
| 64-5022 | 1/1989 | Japan | 264/1.7 |
| 5-142436 | 6/1993 | Japan | 385/14 |

*Primary Examiner*—Mathieu D. Vargot
*Attorney, Agent, or Firm*—Gary F. Witting

[57] ABSTRACT

A flexible circuit film (103) having a plurality of electrical tracings (118) is provided. A mold (102) having a cavity (112) capable of accepting the flexible circuit film (103) is provided. The flexible circuit film (103) is placed into the mold (102). A first optical portion (203) is molded with the flexible circuit film (103) in the cavity (112) of the mold (102) so as to join the flexible circuit film (103) to the first optical portion (203).

3 Claims, 3 Drawing Sheets

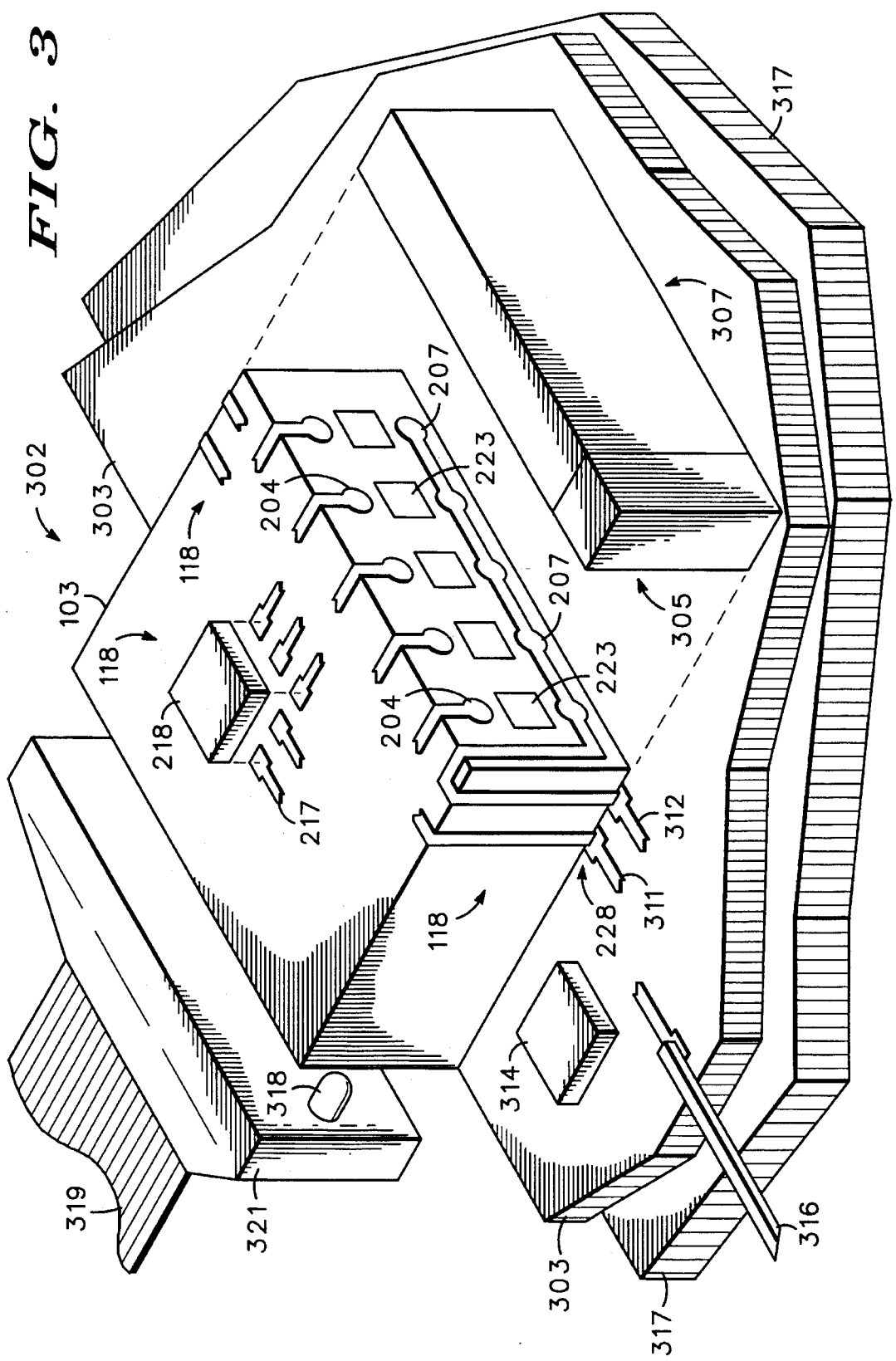

5,482,658

METHOD OF MAKING AN OPTOELECTRONIC INTERFACE MODULE

BACKGROUND OF THE INVENTION

This invention relates, in general, to fabrication of optical devices and, more particularly, to manufacturing an optoelectronic interface submodule.

This application is related to issued U.S. Pats. bearing U.S. Pat. Nos. 5,265,184 and 5,276,754, titled MOLDED WAVEGUIDE AND METHOD OF MAKING SAME and OPTOELECTRONIC MOUNT AND METHOD FOR MAKING, filed on May 28, 1992 and on Aug. 31, 1992, issued on Nov. 23, 1993 and Jan. 4, 1994 which are hereby incorporated by reference herein. Further, this application is related to application bearing Ser. No. 08/019,731, titled MOLDED WAVEGUIDE WITH A UNITARY CLADDING REGION AND METHOD OF MAKING, filed on Feb. 19, 1993.

At present, interconnection of a photonic device and a waveguide to form an optoelectronic interface submodule is a difficult task that typically employs a manual method or a semi-automatic method for interconnecting or mating of the waveguide and the photonic device. Further, interconnection of the optoelectronic interface submodule to an interconnect substrate also is achieved by either a manual method or a semi-automatic method such as wire bonding. These manual or semi-automatic methods for interconnecting the optoelectronic interface submodule to the interconnect substrate typically are difficult tasks that are complex, inefficient, and not suitable for high volume manufacturing.

For example, one major problem associated with interconnection of the optoelectronic submodule to an interconnect substrate is devising a fabrication method and a structure that allows electrical and mechanical coupling between the optoelectronic interface submodule and the interconnection substrate. As practiced in the prior art, interconnection of the optoelectronic submodule to the interconnect substrate is achieved by carefully positioning the prepared optoelectronic substrate on the interconnect board and subsequently wire bonding the photonic devices so as to achieve electrical interconnection between the photonic devices and the interconnect board. However, many problems arise by wire bonding the optoelectronic submodule to the interconnect board, such as being extremely labor intensive, costly, inaccurate, as well as providing additional problems with encapsulation, such as wire sweep, reliability, and the like, Moreover, if for any reason one of the wire bonds is unsuitable or unreliable, product can be manufactured that is both unreliable or unusable, thus increasing cost and reducing manufacturing capability.

It can be readily seen that conventional methods for interconnecting an optoelectronic interface submodule to an interconnect substrate have severe limitations. Also, it is evident that conventional processes that are used to fabricate interconnection between the interconnect substrate and the photonic devices are extremely fragile and are susceptible to both reliability and manufacturing problems. Further, the conventional manufacturing methods are not only complex and expensive, but also are not amenable to high volume manufacturing. Therefore, a method and article for interconnecting a prepared optoelectronic interface submodule and an interconnect substrate is highly desirable.

SUMMARY OF THE INVENTION

Briefly stated, a method is provided that joins a flexible circuit film to an optical portion. A flexible circuit film having a plurality of electrical tracings is provided. A mold having a cavity capable of accepting the flexible circuit film is provided. A flexible circuit film is placed into the mold. A first optical portion is molded with the flexible circuit film in the cavity of the mold so as to join the flexible circuit film to the first optical portion.

BRIEF DESCRIPTION OF THE DRAWINGS

FIG. 3 is a greatly enlarged simplified perspective view of an optoelectronic submodule mounted on an interconnect substrate.

DETAILED DESCRIPTION OF THE DRAWINGS

Figure 1:
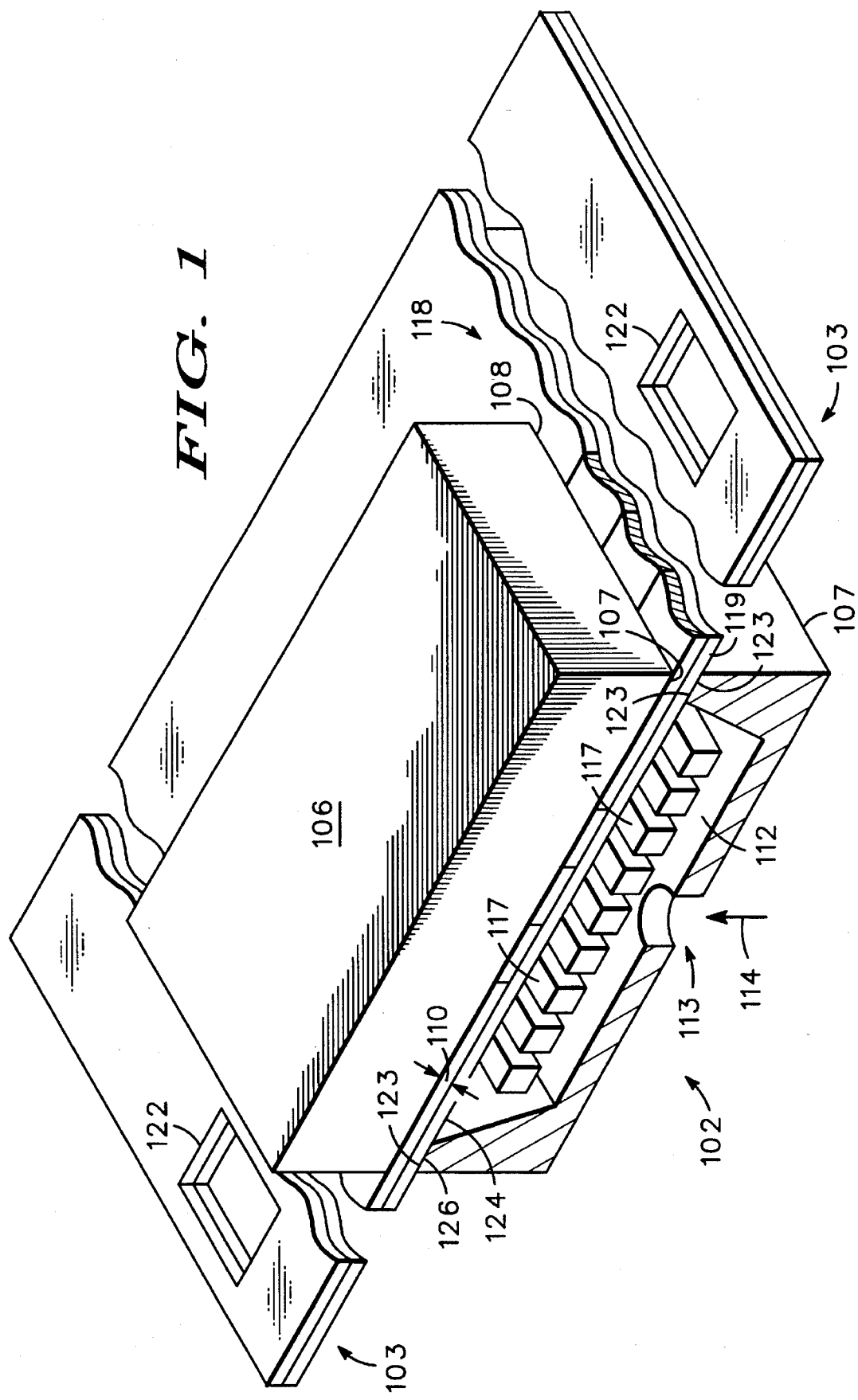
FIG. 1 is a greatly enlarged simplified perspective view, portions thereof removed and shown in section, of a mold.

FIG. 1 is a greatly simplified enlarged perspective view, portions thereof removed and shown in section, of a mold 102 capable of accepting a flexible circuit tape 103. It should be understood that FIG. 1 has been greatly simplified, thus many specific engineering details have been omitted from the illustration, thereby more clearly illustrating the present invention.

Generally, mold 102 is similar to the molds described in all applications referenced hereinabove. Briefly, mold 102 includes a first portion or upper portion 106 and a second portion or lower portion 107.

Upper portion or first portion 106 of mold 102 has a surface 108 that comes in contact with a surface 109 of flexible circuit film 103. Surface 108 of first portion 106 generally is a flat surface that is capable of being modified to a variety of structures that facilitate moving, holding, and positioning of flexible circuit film 103 in relation with surface 108.

Lower portion or second portion 107 of mold 102 is made to provide a cavity 112. It should be understood that cavity 112 forms a sealed chamber (not shown) when first portion 106 and second portion 107 are compressed together with flexible circuit film 103 therebetween. Further, it should be realized that portions of mold 102 and a portion of flexible circuit film 103 have been removed to show internal features thereof. Generally, cavity 112 is capable of being shaped or formed into any suitable shape or form. The shape or form of cavity 112 is application specific, thus allowing a large variety of features having different shapes and sizes to be formed. For example, indents or grooves are capable of being molded that upon subsequent processing will form core regions, alignment guides are capable of being molded, and of course, specific dimensions of cavity 112 vary depending upon the specific application. Additionally, cavity 112 is capable of being configured or made to accept core regions 117; however, it should be understood that core regions 117 are not necessary for the present invention. For example, cavity 112 could be used to mold an optical portion or a first optical portion not having core regions, such as a first cladding region which is subsequently adhered to a second cladding region or second optical portion to form a waveguide core regions. Additionally, lower portion 107 of mold 102 includes an input port 113 enabling injection, illustrated by arrow 114, of molding compounds into cavity 112.

Flexible circuit tape 103 is made from any thin insulative material, such as those typically suitable for Tape Automated Bonding (TAB) backing layer or substrate. As an example, polyimide is a representative material, but is certainly not the only one; polyimide type materials are capable of being found under the tradename such as "UPLEX" or "KAPTON", among others. Other suitable materials include, but are not necessarily limited to polyester material (lower in cost and performance than polyimide), mylar materials, and composite materials, such as a resin filled epoxy or fiber reinforced materials.

Figure 2:
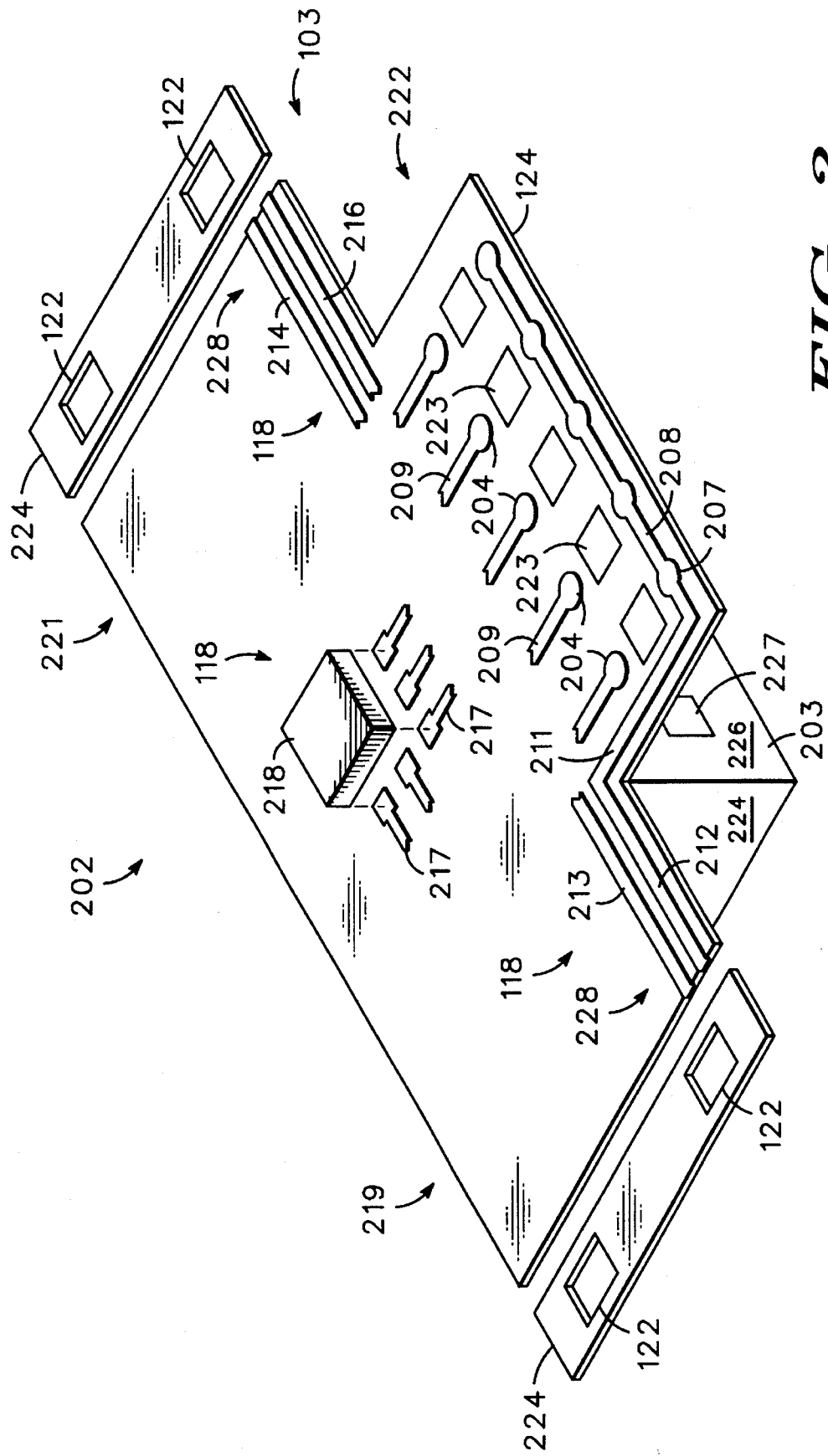
FIG. 2 is a greatly enlarged simplified perspective view of a flexible circuit film joined to an optical portion.

Flexible circuit tape 103 bears a plurality of conductive tracings or a plurality of electrical tracings 118, more fully illustrated in FIG. 2, disposed either thereon or therein, that are formed by any suitable method, such as but not limited to plating, etching, photolithography, printing, etc. Typically, the plurality of conductive tracings or the plurality of electrical tracings 118 are made of a metal or metal alloy, such as copper, aluminum, tin, or titanium/tungsten (TiW), or the like. Adhesion of the plurality of conductive tracings 118 to the substrate 119 is such that a plurality of conductive tracings 118 will not delaminate or separate from substrate 119 when flexible circuit tape 103 is bent or formed into position. The plurality of conductive tracing 118 is capable of having a thickness 110 that ranges from 5.0 mills to 50.0 mills. However, in a preferred embodiment of the present invention, a nominal thickness 110 of the plurality of conductive tracings ranges from 15.0 mills to 20.0 mills.

Molding material or molding compound used for molding or injecting into cavity 112 of mold 102 is capable of being any suitable material, such as polymers, epoxies, plastics, polyimides, or the like. In a preferred embodiment of the present invention, epoxy materials are used to fill cavity 112 so as to form a first optical portion 203, shown in FIG. 2, and bond flexible circuit film 103 to first optical portion 203. In general, molding parameters such as pressure, time, and temperature used to mold or inject the molding material into cavity 112 of mold 102 range approximately from 20.0 pounds per square inch to 2,000 pounds per square inch, from 2.0 minutes to 20.0 minutes, and from 150.0 degrees Celsius to 300.0 degrees Celsius, respectively. Further, materials selected for manufacturing of flexible circuit tape 103 are compatible with the molding parameters of the specific molding compounds or materials used. For example, in a preferred embodiment of the present invention, epoxy material is used for the molding compound and polyimide material is used for substrate 119 of flexible circuit tape 103. Additionally, it should be understood that materials selected for substrate 119 are capable of bonding or joining with molding materials that are injected into cavity 112 through port 113, thus upon completion of the molding process flexible circuit film 103 is joined or bonded to the shape or form that is defined by cavity 112. Further, it should be evident that materials that exceed these requirements or performance levels are also suitable to be used.

As can be seen in FIG. 1, flexible circuit tape 103 is provided with openings 122. Openings 122 allow flexible circuit tape 103 to be moved or indexed in a continuous fashion, thus allowing the molding process that joins flexible circuit tape 103 to the form molded in cavity 112 to be automated. Moreover, openings 122 offer a further advantage of aligning flexible circuit tape 103 to mold 102.

In the present invention, joining or mating of flexible circuit tape 103 to the form or the shape that is molded in cavity 112 is achieved by way of example with the following steps. With first portion 106 and second portion 107 open to expose cavity 112, flexible circuit tape 103 is indexed to an appropriate position. Upon completion of indexing of flexible circuit tape 103, first and second portions 106 and 107 are closed on flexible circuit tape 103, thus surface 108 of first portion 106 is in contact with surface 109 of flexible circuit tape 103 and a portion 123 of surface 124 of flexible circuit tape 103 is in contact with surfaces 126 of lower portion 107, thereby sealing cavity 112 along it's periphery by the contact between surface 123 and surface 126. It should be evident that elements, such as core regions 117 that require encapsulation by molding materials need to be placed into cavity 112 prior to closing or sealing of upper portion 106 and lower portion 107.

Upon sealing or closure of upper portion 106 and lower portion 107 with flexible circuit tape 103 therebetween, molding material is injected in to cavity 112, indicated by arrow 114, through input port 113, thereby filling cavity 112. Additionally, it should be pointed out that specific optical qualities of the molding material that is injected into cavity 112 is dependent upon specific applications. For example, with core regions 117 being placed inside cavity 112, final refractive index of molding material that is injected into cavity 112 typically is adjusted so that core regions 117 have at least a 0.01 higher optical refractive index, thus guiding light effectively and efficiently through core regions 117. In yet another example, suitable molding material is injected into cavity 112 to form a first optical portion that is subsequently processed, for example, joined with an optical adhesive to a second optical portion in order to form a waveguide having core regions.

Referring now to FIG. 2, a partially completed optical interface submodule 202 having an optical portion 203 that is joined or bonded to flexible circuit film 103. It should be understood that features or elements previously discussed in FIG. 1 will retain their original identification numerals. Further, it should be understood that optical portion 203 is a result of the molding process previously described in FIG. 1.

As can be seen in FIG. 2, the plurality of electrical tracings 118 are now capable of being more fully illustrated. However, it should be understood that the plurality of electrical tracings 118 are capable of having a large variety of configurations, thus the specific configuration illustrated in FIG. 2 is only representative of one of many configurations possible.

The plurality of electrical tracings 118 illustrated in FIG. 2 includes electrical traces 208, 209, 211, 212, 213, 214, 216, bonding pads 217, and contacts 204 and 207. Bonding pads 217 are used for mounting integrated circuit 218 to the plurality of electrical tracings 118, thereby mechanically and electrically integrating or interconnecting integrated circuit 118 with the plurality of electrical traces 118.

Contacts 204 are capable of having a variety of functions, such as signal input and output, power input and output, and the like. These various functions are integrated into the plurality of electrical tracings 118 via electrical traces 109. Additionally, in this particular example, contacts 207 function as a ground and are interconnected by traces 208. Contacts 207 and electrical traces 208 are further connected by electrical trace 211 which is further connected to electrical trace 212. Electrical traces 212, 213, 214 and 216 extend out on peripheral portions 219 and 221, respectively.

Further, contacts 204, contacts 207, electrical tracings 208, and areas 223 are located on peripheral portion 222 of flexible circuit film 103.

Generally, partially completed optoelectronic interface submodule 202 is configured with an optical portion 203 being joined to flexible circuit film 103. It should be understood that since portions of flexible circuit film 103 were not in contact with the molding compounds during the molding process, peripheral portions 219, 221 and 222 result from not having the molding compound come in contact with peripheral portions 219, 221, and 222.

Areas 223 of flexible circuit film 103 are optically transparent, thereby allowing optical signals to pass through areas 223. Areas 223 are made optically transparent by any suitable method, such as removing portions of flexible circuit film 103, photolithographically processing, laser ablating, selecting a material that is transparent to a wavelength of light that is intended to be used, or the like.

Peripheral portions 219, 221, and 222 are now capable of being formed along surfaces 224, 226, respectively, and along a surface not capable of being viewed in this figure. By forming peripheral portions 219, 221, and 222 against surfaces 224 and 226 and the surface that is not visible in this particular view, enables electrical tracings 212, 213, 214, 216, contacts 204, areas 223, and contacts 207 to be bent into a compact configuration. Additionally this compact configuration allows electrical continuity around the corners of optical portion 203. More particularly electrical tracings 212, 213, 214, and 216 are now capable of being used as leads that are illustrated in FIG. 3.

Generally, the forming of peripheral portions 219, 221, and 222 is achieved by mechanically bending peripheral portions 219, 221, and 222 into place. Additionally, peripheral portions 219, 221, and 222 are capable of being secured by any suitable adhesive, such as optically clear or transparent epoxies, polyimides, or the like. Further, it should be understood that use of a transparent adhesive may not be necessary for adhering of peripheral portions 219 and 221, adhesion of peripheral portion 222 to surface 226, in a preferred embodiment would use an optically clear adhesive.

FIG. 3 is a simplified partially exploded perspective view of an optoelectronic submodule 302 mounted on an interconnect board 303. In the present invention, optoelectronic submodule 302, photonic device 307 and standard electronic components, illustrated by IC 314, are electrically coupled to an interconnect substrate 303. Additionally, it should be evident that many more different types, such as capacitors, resistors, and the like are capable of being mounted on interconnect substrate 303.

Optoelectronic submodule 302 is capable of being interconnected or electrically coupled with a photonic device 307. Photonic device 307 is capable of being an individual optical transmitter, such as a laser or a light emitting diode (LED) (not shown), an optical receiver or photo detector, such as a photo diode (not shown) or a combination of both photo transmitters and photo detectors.

Alternatively, photonic device 307 is capable of being a photo transmitter, photo receiver, or a combination of both photo transmitters and photo receivers that are mounted on optoelectronic submodule 302. Photonic device 307 is mounted to optoelectronic submodule 302 in such a manner that individual working portions 305 of photonic devices 307 are aligned to core regions 227 through areas 223 of flexible circuit film 103. As shown in FIG. 3, photonic device 307 is mounted to optoelectronic submodule 302.

Typically, photonic device 307 is mounted by any suitable method such as solder bump balls, electrically conductive epoxy, or the like. More specifically, by way of example solder bump balls (not shown) serve to interconnect contacts 204 and contacts 207 with a first and second contact (not shown) on photonic device 307, respectively. By accurately mounting photonic device 307 to optoelectronic submodule 302, light transmission or light reception involving a working portion 305 of photonic device 307 is directed through areas 223 of flexible circuit film 103 into or out of the plurality of core regions 227 (not shown in FIG. 3), thus maximizing signal performance through optoelectronic submodule 203 while relaxing alignment tolerances of mounting photonic device 307 to optoelectronic submodule 302.

Generally, optoelectronic submodule 302 is mounted to interconnect substrate 303 by any suitable method. However, in a preferred embodiment of the present invention, terminal portions 228 of the plurality of electrical tracings 118 on peripheral portions 219 and 221 are trimmed and formed into "J" leads, thereby allowing easy and efficient surface mounting of optoelectronic submodule 302 to interconnect substrate 303. For example, terminal portions 228 formed into "J" leads are surface mounted to bonding pads 311 and 312. It should be evident that by forming terminal portions 228 into a surface mounting configuration such as "J" leads enhances the ability to use automation for placing and mounting optoelectronic submodule 302 to interconnect substrate 303. Further, it should be pointed out that contacts 207, in this specific embodiment, are used for grounding structures; however, it should be noted that many other different types of grounding structures are capable of being formed or utilized in the present invention.

Subsequent electrical coupling of standard electronic components, as illustrated by integrated circuit 314 on interconnect substrate 303 is achieved by ordinary methods well known in the art. It should be evident by one of ordinary skill in the art, that many more electrical couplings typically are necessary to fully utilize inputs and outputs of both standard electrical components and the optical components. It should be further evident that standard input and output means, represented by lead 316, are used to couple other electronic components to interconnection substrate 303. It should be also evident that while lead 316 is shown in FIG. 3, other configurations of input and output means or methods are capable, such as pin-grid arrays, bump bonding arrays, or the like.

Further, plastic encapsulation of optoelectronic submodule 302 and interconnect substrate 303 is capable of being achieved by an overmolding process, represented by plastic piece 317 which is capable of encapsulating interconnect board 303 and optoelectronic interface submodule 302. However, it should also be understood that an alignment guide, such as alignment ferrules are capable of being formed by several methods, such as molding, joining a first optical portion and a second optical portion to form an alignment guide, precision milling, and the like so to enable engagement of alignment pins 318 (only one shown) with alignment ferrules, thereby providing accurate and repeatable alignment of the plurality of core regions 227 (shown in FIG. 2) to an optical cable 319 having an optical connector 321.

By now it should be appreciated that a novel method for joining a flexible circuit film to an optical portion and forming portions of the flexible circuit film into terminal ends such as "J" leads has been described. The method and article of the present invention allow for easy and efficient surface mounting of an optoelectronic interface to an interconnect substrate, thereby incorporating and integrating photonic devices with standard electronic components. Further the method and article of the present invention allow for integration of optoelectronic components to standard electronic components in a cost effective manner by providing a way to eliminate costly steps carried out by hand into automating these manufacturing steps.

What is claimed is:

1. A method for joining a flexible circuit film to an optical portion comprising the steps of:

providing a flexible circuit film having a plurality of electrical tracings;

providing a mold having a cavity capable of accepting the flexible circuit film;

placing the flexible circuit film in the mold., the flexible circuit film having a portion of the plurality of electrical tracings extending beyond the cavity of the mold, thereby having the portion of the plurality of the electrical tracings of the flexible circuit film that extends beyond a first optical portion exposed;

molding the first optical portion with the flexible circuit film in the cavity of the mold so as to join the flexible circuit film to the first optical portion;

providing a second optical portion;

joining the first optical portion and the second optical portion with an optical adhesive to form a waveguide having a core region and a cladding region; and forming the portion of the plurality of electrical tracings that extends beyond the first optical portion to a terminal end.

2. A method for joining a flexible circuit film to an optical portion as claimed in claim 1 wherein the terminal end is shaped into a "J" lead configuration.

3. A method for joining a flexible circuit film to an optical portion as claimed in claim 1 wherein the step of joining the first optical portion and the second optical portion forms an alignment guide.

* * * * *